（12) United States Patent
Chen et al.

(10) Patent No.: US 9,059,052 B2
(45) Date of Patent: Jun. 16, 2015

(54) ALTERNATING OPEN-ENDED VIA CHAINS FOR TESTING VIA FORMATION AND DIELECTRIC INTEGRITY

(71) Applicant: International Business Machines Corporation, Armonk, NY (US)

(72) Inventors: Fen Chen, Williston, VT (US); Cathryn J. Christiansen, Huntington, VT (US); Roger A. Dufresne, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/895,605

(22) Filed: May 16, 2013

(65) Prior Publication Data

US 2014/0339558 A1   Nov. 20, 2014

(51) Int. Cl.
*G01R 31/26*   (2014.01)
*H01L 21/66*   (2006.01)

(52) U.S. Cl.
CPC ............. *H01L 22/14* (2013.01); *H01L 22/34* (2013.01)

(58) Field of Classification Search
CPC ...................................................... H01L 22/32
USPC .......... 438/14–18; 324/500–556; 257/48, 620
See application file for complete search history.

(56) References Cited

U.S. PATENT DOCUMENTS

| | | | |
|---|---|---|---|
| 4,801,869 A | 1/1989 | Sprogis | |
| 5,262,719 A | 11/1993 | Magdo | |
| 5,874,318 A | 2/1999 | Baker et al. | |
| 6,362,634 B1 | 3/2002 | Jarvis et al. | |
| 6,600,333 B1 | 7/2003 | Martin et al. | |
| 7,279,410 B1 | 10/2007 | Okada et al. | |
| 7,285,860 B2 | 10/2007 | Cohn et al. | |
| 7,620,931 B2 | 11/2009 | Adkisson et al. | |
| 8,383,507 B2 | 2/2013 | Chanda et al. | |
| 2002/0081814 A1 | 6/2002 | Ning | |
| 2008/0197513 A1 | 8/2008 | Restaino et al. | |
| 2008/0239619 A1 | 10/2008 | Okamoto | |
| 2008/0304205 A1 | 12/2008 | Bang | |
| 2011/0187382 A1* | 8/2011 | Martin et al. | 324/537 |
| 2012/0261724 A1 | 10/2012 | Chen | |
| 2013/0082257 A1* | 4/2013 | Balasingham et al. | 257/48 |
| 2014/0103495 A1* | 4/2014 | Mackh et al. | 257/620 |

OTHER PUBLICATIONS

"Procedure for the Evaluation of Low-k/Metal Inter/Intra-Level Dielectric Integrity". JEDEC Solid State Technology Association. JEP159. Aug. 2010.*
S.L. Wright et al., "Characterization of Micro-bump C4 Interconnects for Si-Carrier SOP Applications", Electronic Components and Technology Conference, 2006.
"Procedure for the Evaluation of Low-k/Metal Inter/Intra-Level Dielectric Integrity", JEDEC Solid State Technology Association, 2010.

* cited by examiner

*Primary Examiner* — Matthew Landau
*Assistant Examiner* — Eric Ashbahian
(74) *Attorney, Agent, or Firm* — Gibb & Riley, LLC; David A. Cain, Esq.

(57) ABSTRACT

Kerf areas are located between the integrated circuit chips on a wafer. Via chain test structures are located in the kerf areas or test chips. The via chain test structures comprise a first conductor in a first area of the wafer. First via chains are connected at individual points to the first conductor. Each of the first via chains comprises an open-ended electrical circuit beginning at the first conductor and ending in an insulated region of a second area of the wafer. The via chain test structures comprise a second conductor in the second area. Second via chains are connected at individual points to the second conductor. Each of the second via chains comprises an open-ended electrical circuit beginning at the second conductor and ending in an insulated region of the first area.

20 Claims, 10 Drawing Sheets

ALTERNATING OPEN-ENDED VIA CHAINS FOR TESTING VIA FORMATION AND DIELECTRIC INTEGRITY

BACKGROUND

The devices and methods herein relate to the design of via chains and serpentine/comb testable structures, and more specifically, to structures and methods that provide lower resistance and more accurate circuit integrity determination when testing via structures.

An integrated circuit (IC) is a semiconductor device containing many small, interconnected components such as diodes, transistors, resistors, and capacitors. These components function together to enable the IC to perform a task, such as control an electronic device, or perform logic operations. ICs are found in computers, calculators, cellular telephones, and many other electronic devices.

ICs and other semiconductor devices are fabricated on small rectangles, known as "dies," which are filled with multiple layers of the components, such as transistors, resistors, and capacitors, during the fabrication process. The connections between the layers are known as vias. In integrated circuit design, a via is a small opening in an insulating oxide layer that allows a conductive connection between different layers. Multiple vias may be coupled together in what may be referred to as a "via chain" connecting one conductive region in an IC to another conductive region in the same or an adjacent IC.

A manufacturing error in one of the components may render an IC or semiconductor device incapable of functioning properly. For example, consider a memory device containing several ICs. If a transistor within one of the ICs fails to function properly, the memory device may produce memory errors. Vias are also subject to manufacturing errors. When a manufacturing error occurs in a via, the via may not conduct properly and thus may prohibit an IC from functioning correctly. For instance, an open via or a partially open via is a break in the circuit, which may prohibit a device from functioning as designed. An open via may have a high or infinite resistance, and a partially open via may have a higher than average resistance. On the other hand, the via could be shorted to a neighbor interconnect line or via, which may also prohibit a device from functioning as designed. Therefore, testing via structures is a fundamental aspect of IC production and reliability.

SUMMARY

An exemplary wafer structure herein comprises integrated circuit chips. Kerf areas are located between the integrated circuit chips. Via chain test structures are in at least one of the kerf areas and the integrated circuit chips. The via chain test structures comprise a first conductor in a first area of the wafer structure. First via chains are connected at individual points to the first conductor. Each of the first via chains comprises an open-ended electrical circuit beginning at the first conductor and ending in an insulated region of a second area of the wafer structure. The via chain test structures also comprise a second conductor in the second area of the wafer structure. Second via chains are connected at individual points to the second conductor. Each of the second via chains comprises an open-ended electrical circuit beginning at the second conductor and ending in an insulated region of the first area of the wafer structure.

An exemplary structure for testing an integrated circuit herein comprises a first electrically conductive spine having first electrical connectors protruding from a base of the first electrically conductive spine. First via chains are operatively connected to the first electrical connectors. Each of the first via chains comprises an open-ended electrical circuit beginning at the first electrically conductive spine. This structure for testing an integrated circuit also comprises a second electrically conductive spine having second electrical connectors protruding from a base of the second electrically conductive spine. Second via chains are operatively connected to the second electrical connectors. Each of the second via chains comprises an open-ended electrical circuit beginning at the second electrically conductive spine.

An exemplary method comprises simultaneously manufacturing integrated circuit chips on a wafer and forming via chain test structures in at least one of kerf areas of the wafer and the integrated circuit chips. The kerf areas of the wafer are located between the integrated circuit chips. The via chain test structures are tested, and therefore IC manufacturing process can be monitored and reliability performance can also be assessed. After testing the via chain test structures, the wafer is divided to separate the integrated circuit chips from each other in a process that destroys the kerf areas. Forming of the via chain test structures comprises forming a first conductor having first via chains connected at individual points to the first conductor and forming a second conductor having second via chains connected at individual points to the second conductor. The first via chains and the second via chains alternate along a length of the area between the first conductor and the second conductor. The testing comprises performing voltage drop testing, leakage current testing, and/or time-dependent dielectric breakdown (TDDB) testing.

BRIEF DESCRIPTION OF THE DRAWINGS

The devices and methods will be better understood from the following detailed description with reference to the drawings, which are not necessarily drawn to scale and in which.

DETAILED DESCRIPTION

As mentioned above, electrical test and failure analysis of via and/or serpentine structures are fundamental aspects of IC production. The devices and methods herein provide structures and methods that more accurately determine shorting and dielectric breakdown when testing large area structures.

Vias in a semiconductor device may be tested by measuring the resistance of via test chains. This technique identifies via chains containing open vias and some partially open vias by their high resistance. The test module may be located in the kerf region surrounding the semiconductor die. The kerf regions are areas where the semiconductor wafer will be cut to separate individual semiconductor dies when the fabrication process is complete. Semiconductor test structures in semiconductor dies or kerf regions contain vias. The examples below are described for test structures in kerf regions of the wafer; it is contemplated that the test structures may be located inside the semiconductor dies, as well. Vias are conductors that electrically connect one layer of an integrated circuit to another layer. Vias may be connected together to form a via chain. The via chain connects layers of components in the semiconductor test structure. Each layer may contain conductive plates. Each plate couples to at least one other plate by one of the vias.

It is relatively easy to measure shorts and dielectric breakdown in macros with very small area coverage; however, in order to achieve defect density process targets, it is often necessary to make extremely large arrays with several links. In large area structures, the high resistance of the structure creates a large voltage drop along the length of the structure. When the voltage drop along the structure is comparable to the applied voltage, or alternately, when the current travelling along the structure is similar to the leakage current, it becomes difficult or impossible to accurately determine shorts or measure the time and voltage when dielectric breakdown occurs.

Figure 1:
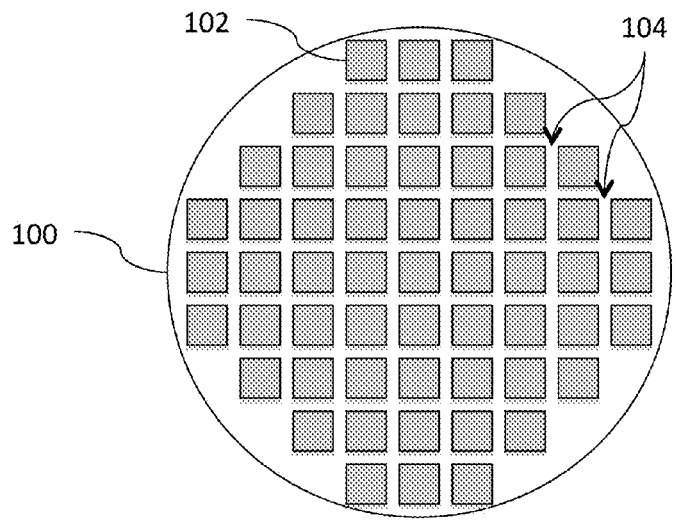
FIG. 1 is a top view schematic diagram illustrating a wafer according to devices and methods herein.
Figure 2:
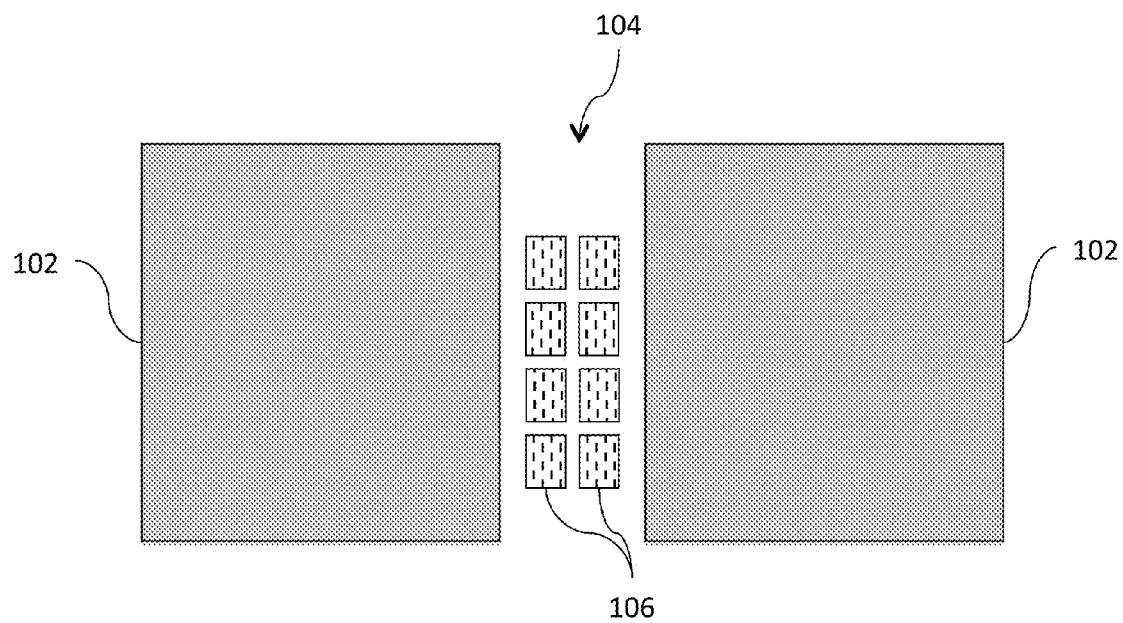
FIG. 2 is a top view schematic diagram illustrating test structures according to devices and methods herein.

Referring now to the drawings, FIG. 1 is a top-view schematic illustration showing a wafer 100 that includes integrated circuit chips 102 and kerf areas 104 located between the integrated circuit chips 102. FIG. 2 is also a top-view schematic illustration of an enlarged portion of the structure shown in FIG. 1. More specifically, FIG. 2 illustrates test structures 106 that are located in a kerf area 104.

Figure 3:
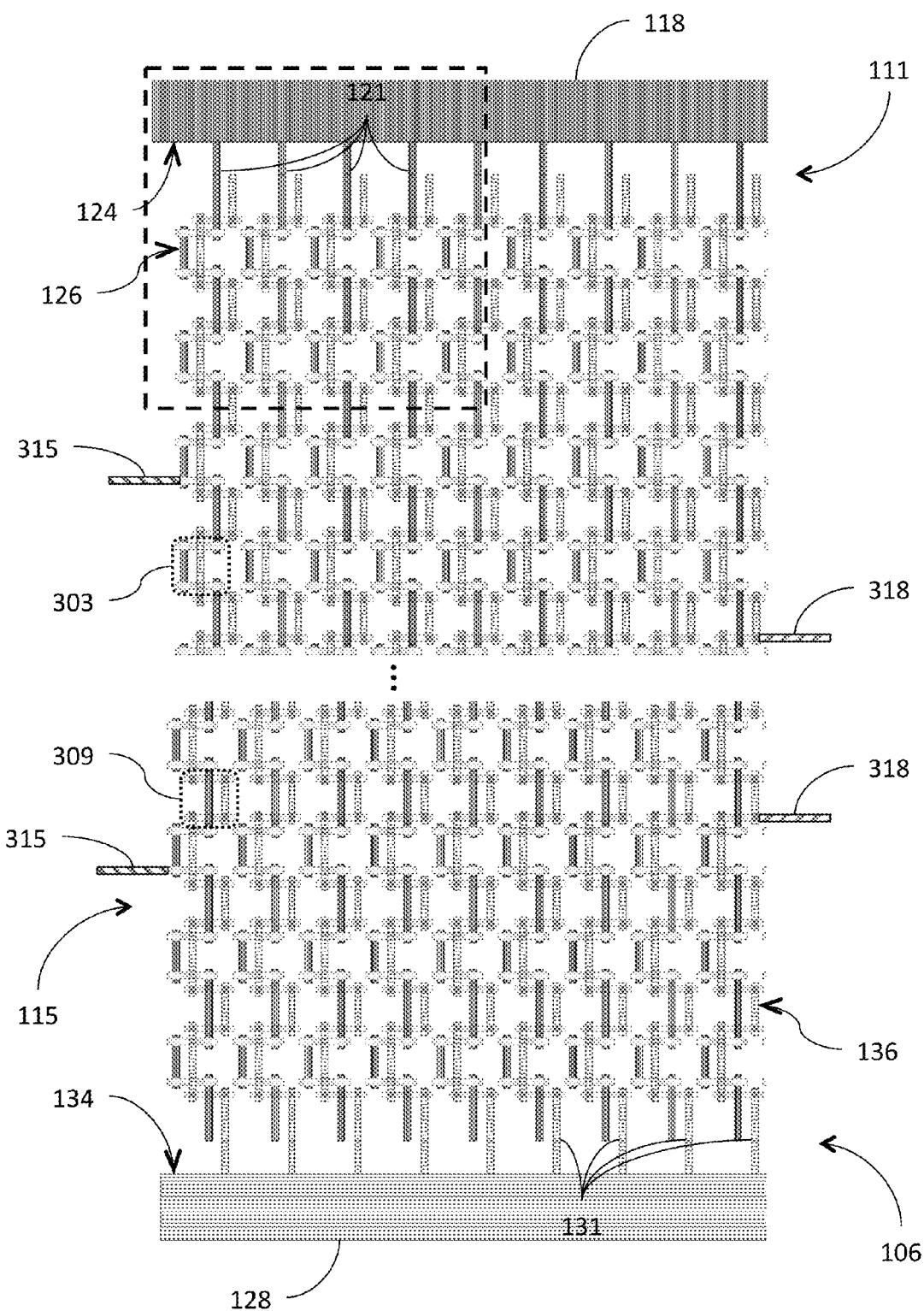
FIG. 3 is a top view schematic diagram illustrating via chains according to devices and methods herein.

FIG. 3 is a top enlarged view of test structures 106 shown in FIG. 2. As shown in FIG. 3, the test structures 106 include a first via test structure 111 and a second via test structure 115 located in one area of the wafer 100. The first via test structure 111 includes a first electrically conductive spine 118 in a first area of the wafer 100. The first electrically conductive spine 118 has first electrical connectors 121 protruding from a base 124 of the first electrically conductive spine 118. First via chains 126 are operatively connected to the first electrical connectors 121. Each of the first via chains 126 comprises an open-ended electrical circuit beginning at the first electrically conductive spine 118 and ending in an insulated region of a second area of the wafer 100 that is adjacent to and contacts the first area of the wafer 100. The second via test structure 115 includes a second electrically conductive spine 128 in the second area. The second electrically conductive spine 128 has second electrical connectors 131 protruding from a base 134 of the second electrically conductive spine 128. Second via chains 136 are operatively connected to the second electrical connectors 131. Each of the second via chains 136 comprises an open-ended electrical circuit beginning at the second electrically conductive spine 128 and ending in an insulated region of the first area.

Figure 4:
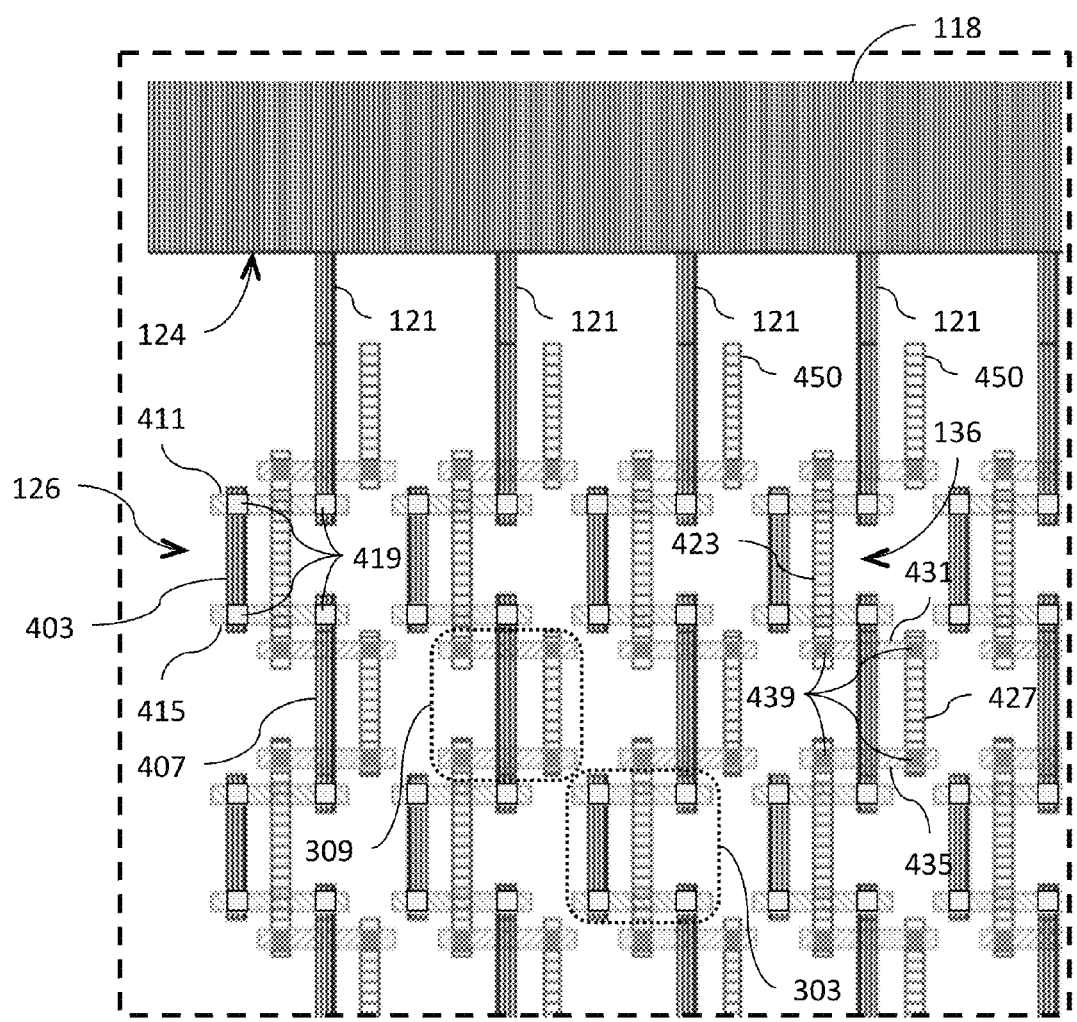
FIG. 4 is a top view schematic diagram illustrating via chains according to devices and methods herein.

Note: the first via chains 126 end near the second electrically conductive spine 128 and the second via chains 136 end near the first electrically conductive spine 118 (as shown in FIG. 4). Thus, the first via test structure 111 begins in the first area and ends in an insulated area of the second area and the second via test structure 115 begins in the second area and ends in an insulated area of the first area. A short in any of the vias will leak current into the surrounding insulated areas. Because the via chains of opposing test structures alternate along the area, such leaking current flows through the insulated area to adjacent vias of the opposing via chains and eventually into the opposing conductive spine, thereby allowing current flow between the first spine and the second spine (which theoretically should be insulated from one another in the absence of any via defects) and such current leakage or flow between the conductive spines identifies defective vias.

Each of the first via chains 126 is made of electrically conductive segments. As shown in FIG. 4, first conductive segments, such as 403, 407, may be formed at a first level of the first via chain 126 in one layer of the wafer 100, and second conductive segments, such as 411, 415, may be formed at a second level of the first via chain 126 in another layer of the wafer 100. The first conductive segments 403, 407 and the second conductive segments 411, 415 are interconnected by vias 419 between the layers of the wafer 100.

Additionally, each of the second via chains 136 is made of electrically conductive segments. As partially shown in FIG. 4, the second via chain 136 is made of first conductive segments, such as 423, 427 formed at a first level, and second conductive segments, such as 431, 435 formed at a second level. The first conductive segments 423, 427 and the second conductive segments 431, 435 are interconnected by vias 439 between the layers of the wafer 100 for the second via chain 136.

Note, the various conductive segments 403, 407, 411, 415 of the first via chain 126 and the various conductive segments 423, 427, 431, 435 of the second via chain 136 form geometrically shaped portions. Referring again to FIG. 3, the geometrically shaped portions, such as 303, of the first via test structure 111 and the geometrically shaped portions, such as 309, of the second via test structure 115 alternate along a length of the kerf area 104. As shown in FIGS. 3 and 4, the conductive segments form a substantially rectangular shape. One ordinarily skilled in the art may use other geometric shapes, such as those that are described in more detail below.

According to devices and methods herein, the first via test structure 111 comprises a first electrical circuit beginning at the first electrically conductive spine 118 within the first area. Each of the first via chains 126 is electrically connected to the first electrically conductive spine 118. Similarly, the second via chain 115 comprises a second electrical circuit that begins at the second electrically conductive spine 128 within the second area. Each of the second via chains 136 is electrically connected to the second electrically conductive spine 128. However, the first via test structure 111, which includes the first via chains 126, is electrically insulated from the second via test structure 115, which includes the second via chains 136.

While each of the first via chains 126 is connected on one end to the first electrically conductive spine 118, the remaining end of each of the first via chains 126 remains free. In a similar fashion, each of the second via chains 136 is connected on one end to the second electrically conductive spine 128, and the remaining end of each of the second via chains 136 remains free. In order to avoid clutter in FIG. 4, some additional wiring of the second via test structure 115 has intentionally been omitted; however, the free end 450 of the second via chains 136 is best seen in FIG. 4.

As is illustrated in FIGS. 3 and 4, each via chain circuit includes a beginning at the electrically conductive spine, a free end, and geometrically shaped groupings of via structures that alternate with other geometrically shaped portions of other via chains.

Test structures 106 can be used to measure leakage current in order to detect short circuits in the vias. For example, a test probe can be applied to each of the first electrically conductive spine 118 and the second electrically conductive spine 128. The first electrically conductive spine 118 is biased at some +V while the second electrically conductive spine 128 remains at ground. Electrical current is measured between the first electrically conductive spine 118 and the second electrically conductive spine 128. If even one pair of vias is shorted, a high leakage current will be detected.

According to devices and methods herein, either or both the first via chains 126 or the second via chains 136 may include one or more test taps 315, 318 and/or spine connections that enable testing within a single metal layer.

While the foregoing examples have discussed only two via test structures, those ordinarily skilled in the art would understand that the number of via test structures is not limited and any of the devices and methods herein could include a large number of via test structures, but such large numbers are not illustrated, simply for ease of illustration and to simplify understanding. In one example shown in FIGS. 5A-5C, three different via test structures 111, 115, 119 are shown in a cross-sectional schematic (FIG. 5A); perspective cross-sectional schematic (FIG. 5B); and perspective elevated-view schematic (FIG. 5C).

Figure 5A:
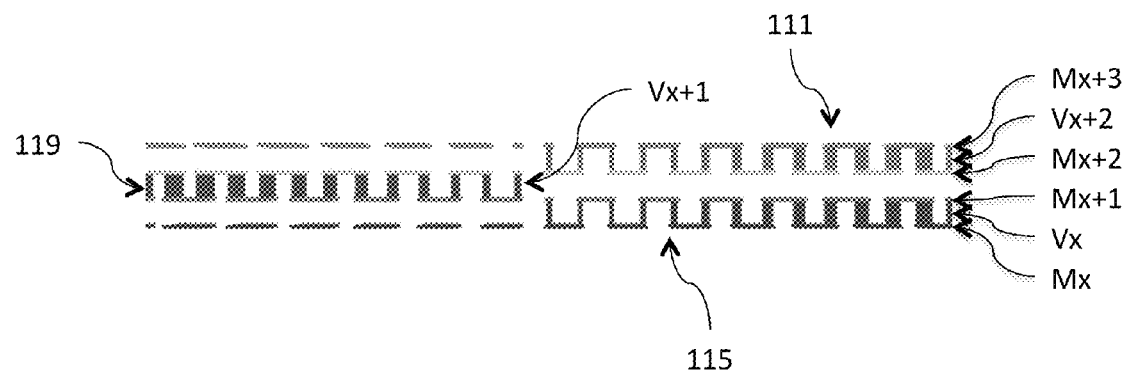
FIG. 5A is a side view schematic diagram illustrating via chains according to devices and methods herein.
Figure 5B:
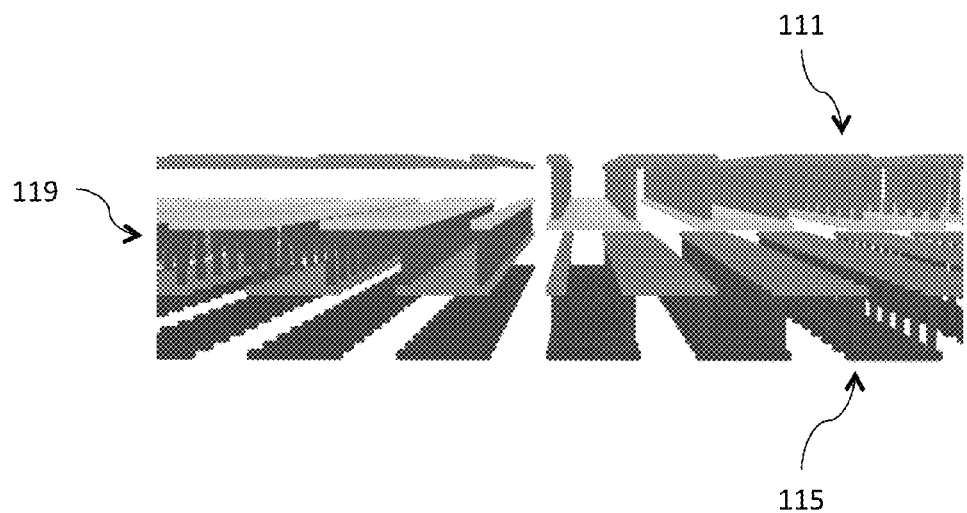
FIG. 5B is a perspective view schematic diagram illustrating via chains according to devices and methods herein.

More specifically, FIG. 5A illustrates three different conductor layers ($M_x$, $M_{x+1}$, and $M_{x+2}$) within an integrated circuit structure, and three different via layers ($V_x$, $V_{x+1}$, and $V_{x+2}$) that connect the different conductor layers together. Therefore, as shown in FIG. 5A, the first via test structure 111 includes vias $V_{x+2}$ that connect conductor layer $M_{x+3}$ and conductor layer $M_{x+2}$. Similarly, the second via test structure 115 includes vias $V_x$ that connect conductor layer $M_{x+1}$ and conductor layer $M_x$. In addition, the third via test structure 119 includes vias $V_{x+1}$ that connect conductor layer $M_{x+2}$ and conductor layer $M_{x+1}$. FIGS. 5A-5C illustrate that the via chains can be on a single layer or two or more layers within the integrated circuit structure.

Figure 5C:
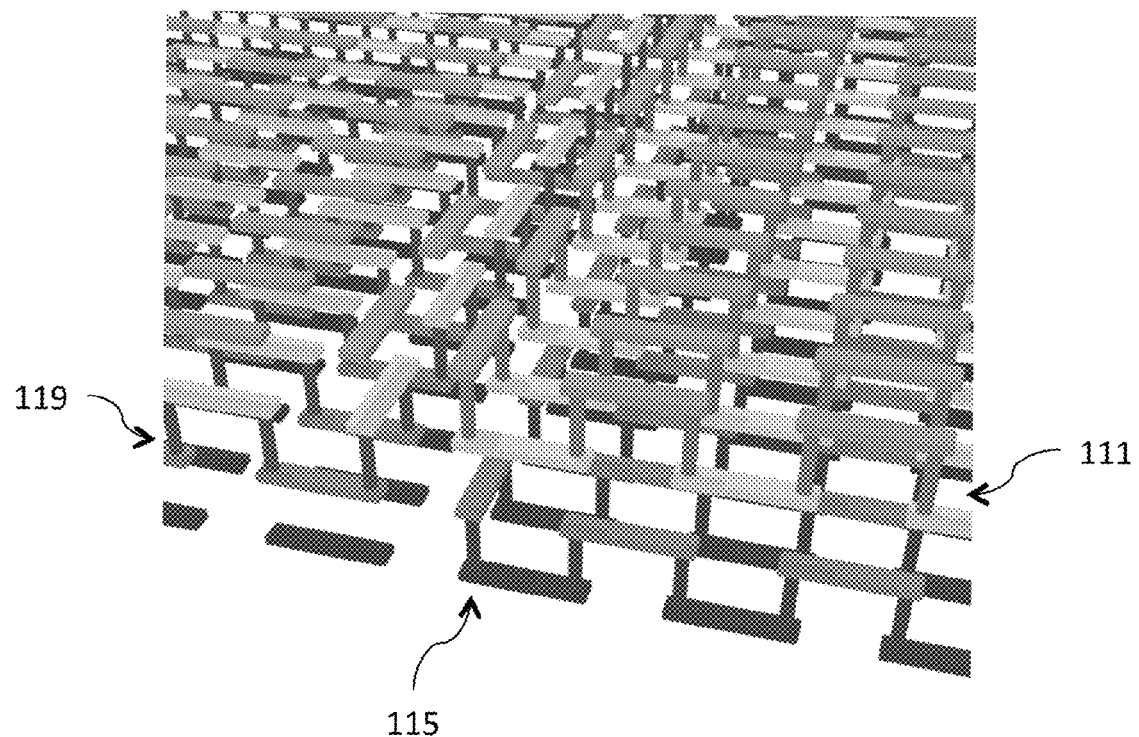
FIG. 5C is a perspective view schematic diagram illustrating via chains according to devices and methods herein.

In order to avoid cluttering the drawings, FIGS. 5A-5C only illustrate a single geometrically shaped portion of each of the via test structures 111, 115, 119; however, those ordinarily skilled in the art would understand that each of the via test structures 111, 115, 119, illustrated in FIGS. 5A-5C, is electrically insulated from the other via test structures, and each via chain comprises an open-ended electrical circuit having multiple ones of the geometrically shaped portions. Further, each of the via chains are connected to wiring that allows each via chain to be tested from a single location (or from multiple locations).

Figure 6A:
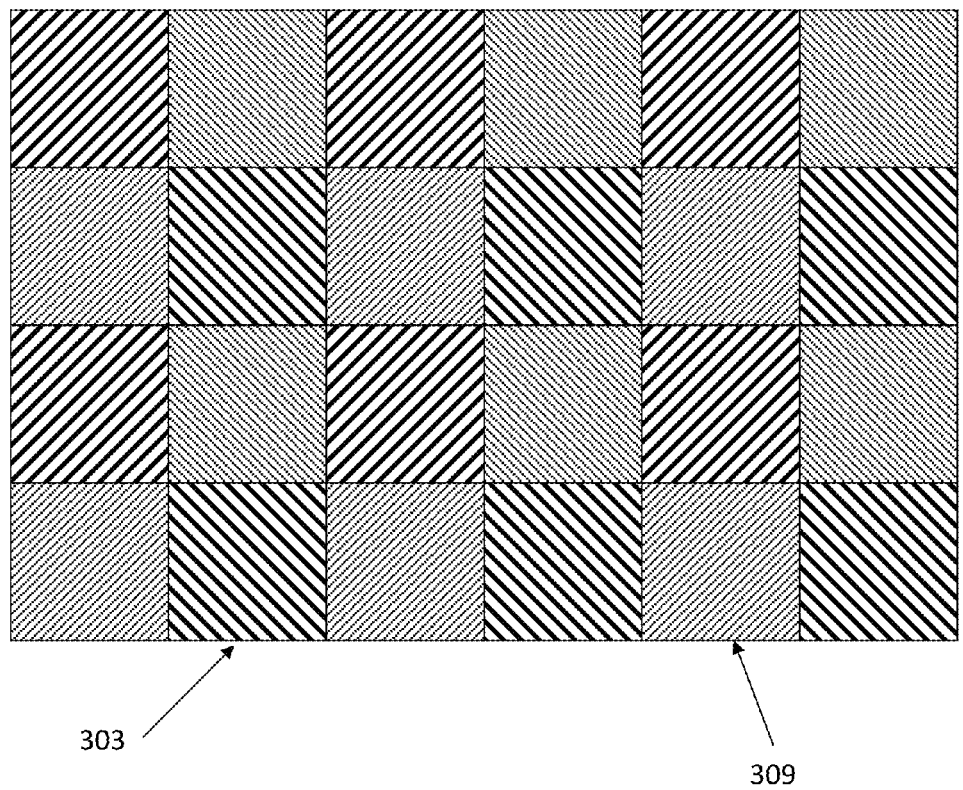
FIG. 6A is a top view schematic diagram illustrating via chains according to devices and methods herein.
Figure 6B:
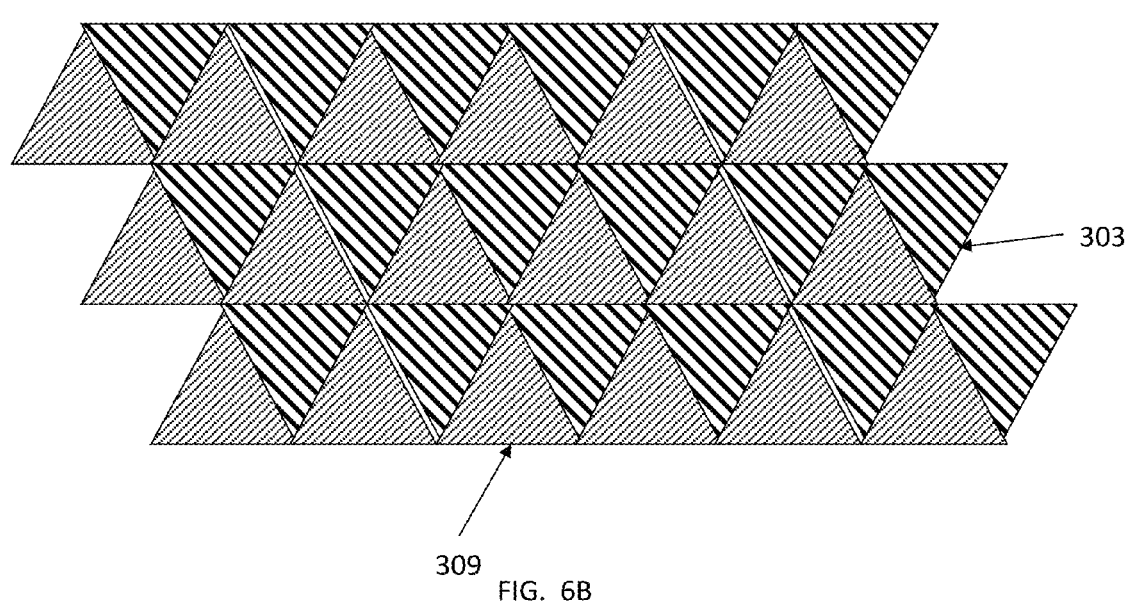
FIG. 6B is a top view schematic diagram illustrating via chains according to devices and methods herein.
Figure 6C:
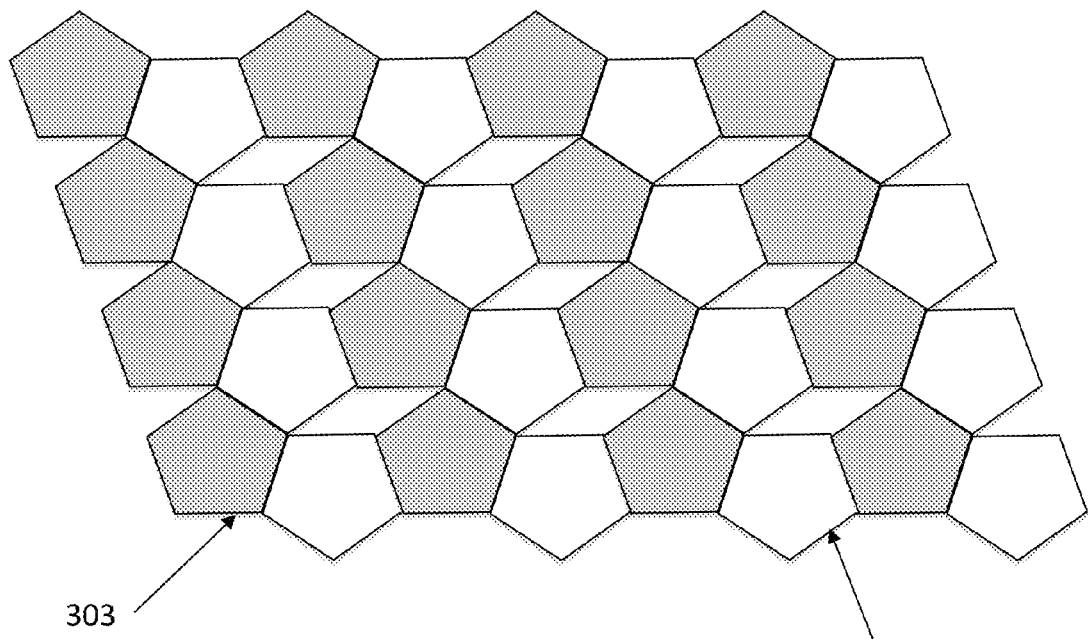
FIG. 6C is a top view schematic diagram illustrating via chains according to devices and methods herein.
Figure 6D:
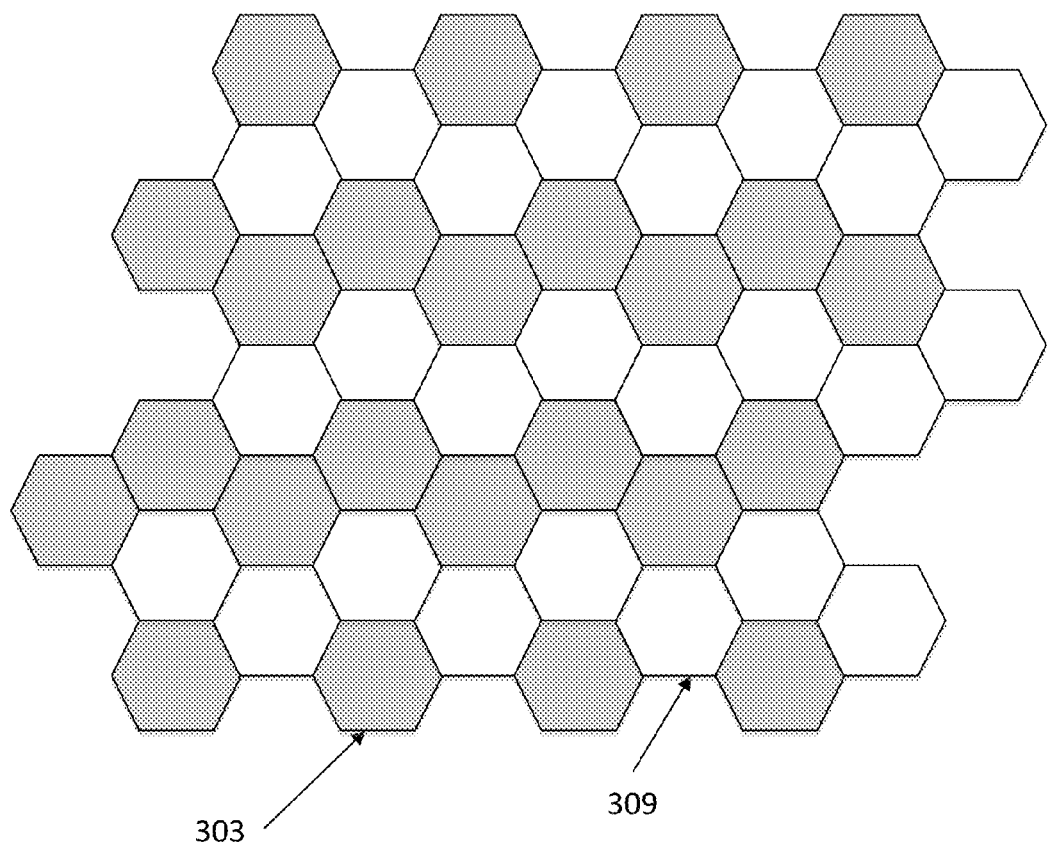
FIG. 6D is a top view schematic diagram illustrating via chains according to devices and methods herein.

The geometrically shaped portions 303, 309 can be of any desired shape including, but not limited to triangles, rectangles, pentagons, hexagons, heptagons, octagons, circles, ovals, etc., and a few of these shapes are illustrated in FIGS. 6A-6D. Note that in FIGS. 6A-6D, only the geometrically shaped portions 303, 309 containing multiple via structures are illustrated, and all wiring and other associated structures are omitted in order to avoid clutter. Therefore, FIG. 6A illustrates square geometrically shaped portions 303, 309 that can be positioned in a checkerboard arrangement. Similarly, FIG. 6B illustrates triangle geometrically shaped portions 303, 309, FIG. 6C illustrates pentagon geometrically shaped portions 303, 309, and FIG. 6D illustrates hexagon geometrically shaped portions 303, 309. While the drawings illustrate a limited number of shapes, those ordinarily skilled in the art would understand that many more shapes could be utilized for the geometrically shaped portions 303, 309 and that the shapes shown here are merely illustrative and do not limit the devices and methods to these specific shapes. Any of the geometric structures can alternate by type, across two or more layers of a kerf area.

As shown above, the via chain test structures 106 comprise a first via test structure 111 and a second via test structure 115 in the kerf area 104. The via test structures 111, 115 are formed such that geometrically shaped portions 303 of the first via test structure 111 and geometrically shaped portions 309 of the second via chain 115 alternate along the length of the kerf area 104.

The via chain test structures 106 described herein enable lower resistance with the same number of vias in the test structures 106, which allows testing to quickly and non-destructively identify whether any defective vias are present and provides more accurate determination of shorts, as well as more accurate dielectric reliability projection.

Testing, using the test structures 106 may include voltage drop testing, current leakage testing, and time-dependent dielectric breakdown (TDDB) testing. In use, the test structures 106 may enable a method for determining a quantitative estimate of the effect of series resistance in the test structure by quantitatively establishing a voltage drop threshold based on actual voltage versus applied voltage.

Figure 7:
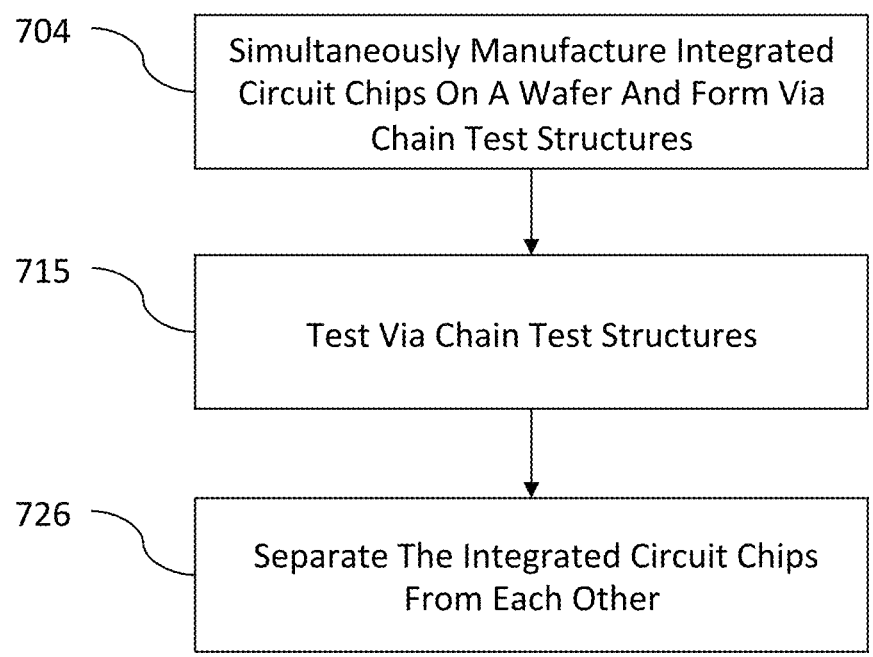
FIG. 7 is a flow diagram illustrating devices and methods herein.

The structures shown above are used to save time and reduce destructive effects when testing. FIG. 7 shows a logic flowchart for a method for testing an integrated circuit, according to devices and methods herein. More specifically, in item 704 an exemplary method herein simultaneously manufactures integrated circuit chips on a wafer and forms via chain test structures in selected areas of the wafer. The selected areas of the wafer may be located in kerf areas between the integrated circuit chips and/or in designated test chips. Forming of the via chain test structures comprises forming a first conductor having a first via chains connected at individual points to the first conductor and forming a second conductor having a second via chains connected at individual points to the second conductor. The first via chains and the second via chains are in an area of the wafer such that geometrically shaped portions of the first via chains and geometrically shaped portions of the second via chains alternate (are interwoven) along a length of the area. The method herein tests the via chain test structures in item 715. The testing comprises performing one of voltage drop testing, current leakage testing and/or time-dependent dielectric breakdown (TDDB) testing. At 726, after testing the via chain test structures, the wafer is divided to separate the integrated circuit chips from each other in a process that destroys the kerf areas.

Via chain test structures having a single starting point and a single ending point are known in the art. One or multiple open vias in a typical intertwined via test chain could lead to the entire chain being unusable for TDDB testing. Standard intertwined via chains suffer from several deficiencies leading to inaccurate reliability projections. For example, the high resistance of a single long via test chain produces a significant voltage drop along the via chain. Such a large voltage drop results in varying voltage acceleration along the via test chain and varying of the active device area under stress. The multiple voltages can then cause the calculated acceleration factor to be too low, resulting in gross over-estimation of the failure rate. Using a higher voltage magnifies the effect.

Figure 8A:
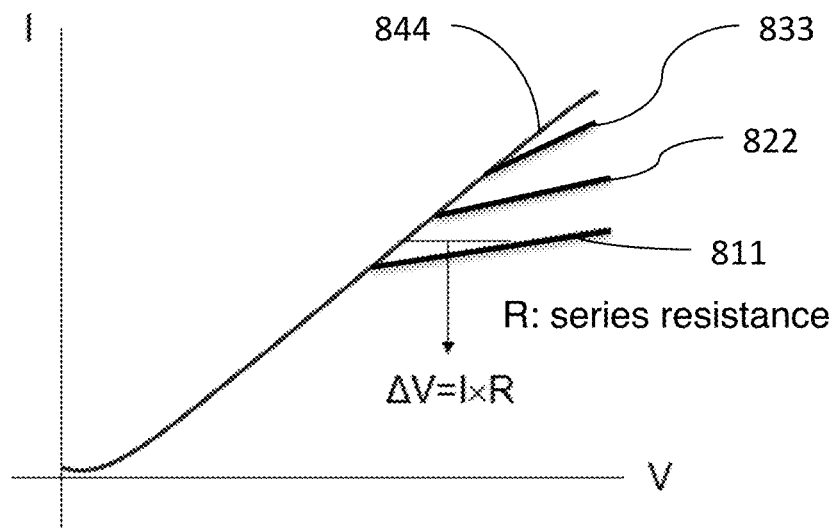
FIGS. 8A and 8B are graphs illustrating devices and methods herein.
Figure 8B:
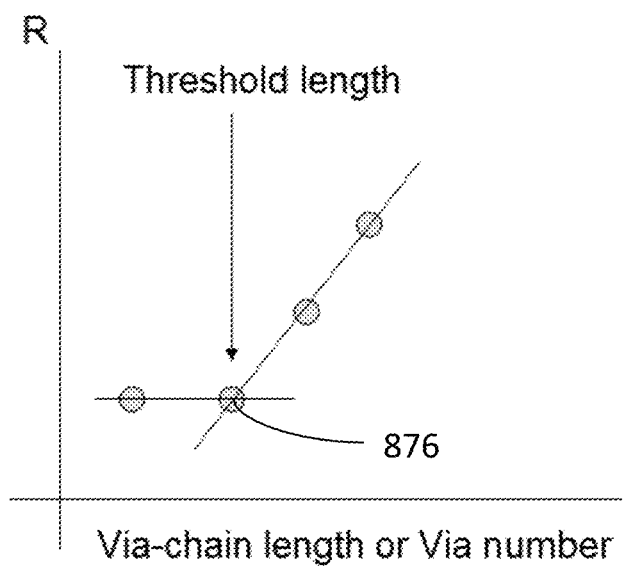

In order to quantify the voltage drop effect on an area of the wafer, at least one standard intertwined via chain test structure and one comb-like via chain test structure, as described herein, can be installed in the same area. For more effective determination of IR voltage drop, a group of chain structures having one traditional via chain test structure and various comb-like via chain test structures with different numbers of vias in each "finger" can be used. The traditional via chain test structure and the total of all the comb-like via chain test structures have the same number of total vias. The IR drop for each structure can be quantitatively determined, as well as series resistance dependence on chain length and leakage current level. The graph in to FIG. 8A shows the leakage current (I) as a function of voltage (V) between a first via test chain and a second via test chain for a group of these structures. The line indicated at 811 shows the IR drop for a traditional via chain test structure. The lines indicated at 822, 833, and 844 represent the IR drop for the comb-like via chain test structures, as described herein, having different numbers of vias per finger. Line 844 has the lowest number of vias, which represents the ideal case. The effective series resistance of the fingers could be determined from the difference between the voltage at a specified current and the ideal case. FIG. 8B shows the resistance plotted against the number of vias per finger. The inflection point 876 of the graph in FIG. 8B indicates a threshold number of vias per chain to be used in the comb-like via chain structure for accurate determination of the time and/or voltage to dielectric breakdown. Once this is done for a given metal and via layer combination for a technology, just one comb-like via chain below the threshold could be used for subsequent leakage current/dielectric integrity testing.

In summary, according to devices herein, an exemplary wafer structure comprises integrated circuit chips. Via chain test structures are in areas of the wafer. The via chain test structures comprise a first conductor in a first area of the wafer. First via chains are connected at individual points to the first conductor. Each of the first via chains comprises an open-ended electrical circuit beginning at the first conductor and ending in an insulated region of a second area of the wafer. The via chain test structures comprise a second conductor in the second area of the wafer. Second via chains are connected at individual points to the second conductor. Each of the second via chains comprises an open-ended electrical circuit beginning at the second conductor and ending in an insulated region of the first area of the wafer.

According to a method of manufacturing a test structure, integrated circuit chips are manufactured on a wafer while simultaneously forming via chain test structures. The via chain test structures may in kerf areas of the wafer and/or test chips. The kerf areas of the wafer are located between the integrated circuit chips. After manufacture, the via chain test structures are tested. After testing of the via chain test structures, the wafer is divided to separate the integrated circuit chips from each other in a process that destroys the kerf areas. Forming of the via chain test structures comprises forming a first conductor having first via chains connected at individual points to the first conductor and forming a second conductor having second via chains connected at individual points to the second conductor. The first via chains and the second via chains are in an area of the wafer such that geometrically shaped portions of the first via chains and geometrically shaped portions of the second via chains alternate along a length of the area. The testing comprises performing voltage drop testing, current leakage testing, and/or time-dependent dielectric breakdown (TDDB) testing.

Aspects of the present disclosure are described herein with reference to flowchart illustrations and/or block diagrams of methods, apparatus (systems), and computer program products according to various systems and methods. It will be understood that each block of the flowchart illustrations and/or two-dimensional block diagrams, and combinations of blocks in the flowchart illustrations and/or block diagrams, can be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The flowchart and block diagrams in the figures illustrate the architecture, functionality, and operation of possible implementations of systems, methods, and computer program products according to various devices and methods herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

According to a further system and method herein, an article of manufacture is provided that includes a tangible computer readable medium having computer readable instructions embodied therein for performing the steps of the computer implemented methods, including, but not limited to, the method illustrated in FIG. 7. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. Any of these devices may have computer readable instructions for carrying out the steps of the methods described above with reference to FIG. 7.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Furthermore, the computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In case of implementing the systems and methods herein by software and/or firmware, a program constituting the software may be installed into a computer with dedicated hardware, from a storage medium or a network, and the computer is capable of performing various functions if with various programs installed therein.

Figure 9:
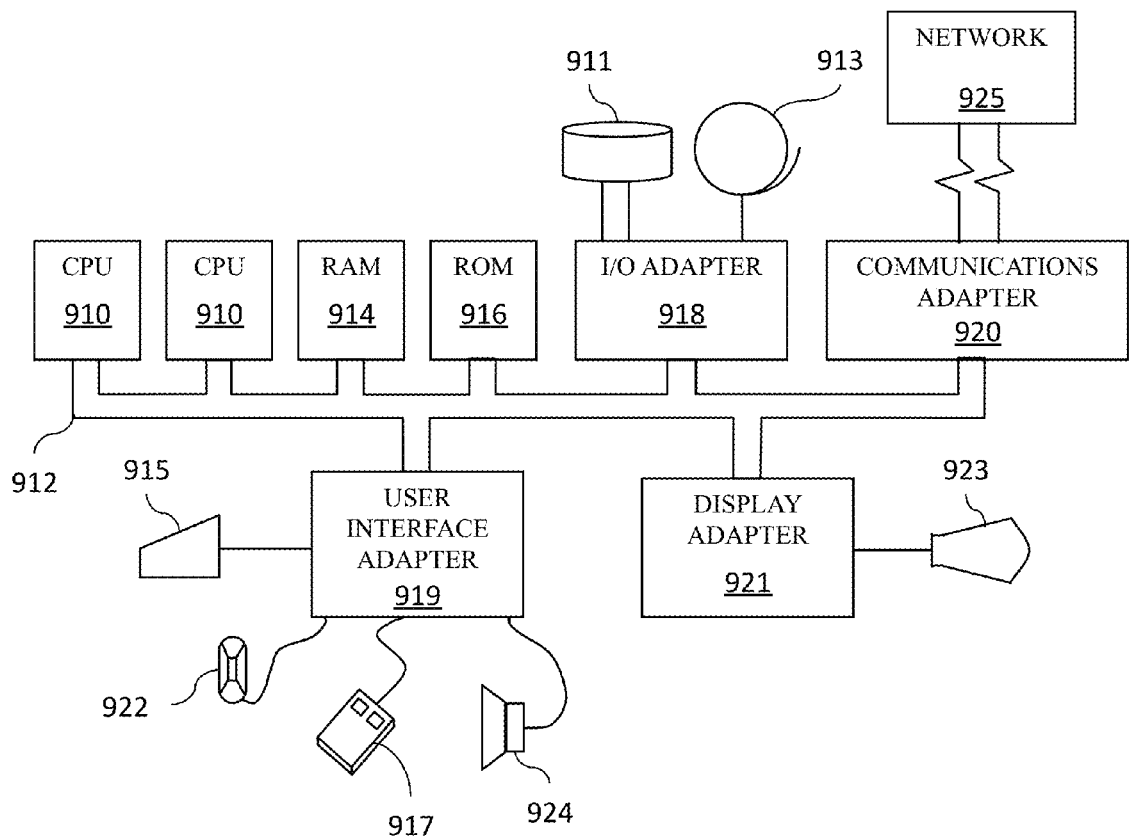
FIG. 9 is a schematic diagram of a hardware system according to devices and methods herein.

A representative hardware environment for practicing the systems and methods herein is depicted in FIG. 9. This schematic drawing illustrates a hardware configuration of an information handling/computer system in accordance with the systems and methods herein. The system comprises at least one processor or central processing unit (CPU) 910. The CPUs 910 are interconnected via system bus 912 to various devices such as a Random Access Memory (RAM) 914, Read Only Memory (ROM) 916, and an Input/Output (I/O) adapter 918. The I/O adapter 918 can connect to peripheral devices, such as disk units 911 and tape drives 913, or other program storage devices that are readable by the system. The system can read the inventive instructions on the program storage devices and follow these instructions to execute the methodology of the systems and methods herein.

In FIG. 9, CPUs 910 perform various processing based on a program stored in a Read Only Memory (ROM) 916 or a program loaded from a peripheral device, such as disk units 911 and tape drives 913 to a Random Access Memory (RAM) 914. In the RAM 914, required data when the CPU 910 performs the various processing or the like is also stored, as necessary. The CPU 910, the ROM 916, and the RAM 914 are connected to one another via a bus 912. An input/output adapter 918 is also connected to the bus 912 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 914, as necessary.

The system further includes a user interface adapter 919 that connects a keyboard 915, mouse 917, speaker 924, microphone 922, and/or other user interface devices such as a touch screen device (not shown) to the bus 912 to gather user input. Additionally, a communication adapter 920 including a network interface card such as a LAN card, a modem, or the like connects the bus 912 to a data processing network 925. The communication adapter 920 performs communication processing via a network such as the Internet. A display adapter 921 connects the bus 912 to a display device 923, which may be embodied as an output device such as a monitor (such as a Cathode Ray Tube (CRT), a Liquid Crystal Display (LCD), or the like), printer, or transmitter, for example.

Those skilled in the art would appreciate that the storage medium is not limited to the peripheral device having the program stored therein as illustrated in FIG. 9, which is distributed separately from the device for providing the program to the user. Examples of a removable medium include a magnetic disk (including a floppy disk), an optical disk (including a Compact Disk-Read Only Memory (CD-ROM) and a Digital Versatile Disk (DVD)), a magneto-optical disk (including a Mini-Disk (MD) (registered trademark)), and a semiconductor memory. Alternatively, the storage medium may be the ROM 916, a hard disk contained in the storage section of the disk units 911, or the like, which has the program stored therein and is distributed to the user together with the device that contains them.

As will be appreciated by one skilled in the art, aspects of the systems and methods herein may be embodied as a system, method, or computer program product. Accordingly, aspects of the present disclosure may take the form of an entirely hardware system, an entirely software system (including firmware, resident software, micro-code, etc.) or an system combining software and hardware aspects that may all generally be referred to herein as a "circuit," "module", or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a Read Only Memory (ROM), an Erasable Programmable Read Only Memory (EPROM or Flash memory), an optical fiber, a magnetic storage device, a portable compact disc Read Only Memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Deployment types include loading directly in the client, server, and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Alternatively, the process software is sent directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

While it is understood that the process software may be deployed by manually loading directly in the client, server, and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular devices and methods only and is not intended to be limiting of the devices and methods. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various devices and methods herein have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein with various modifications as are suited to the particular use contemplated.

What is claimed is:

1. A method comprising:
    manufacturing integrated circuit chips on a wafer and forming via chain test structures in kerf areas of said wafer, said kerf areas of said wafer being located between said integrated circuit chips;
    testing said via chain test structures; and
    after testing said via chain test structures, dividing said wafer to separate said integrated circuit chips from each other in a process that destroys said kerf areas,
        said forming said via chain test structures comprising forming a first conductor in a first area of said wafer, said first conductor comprising an electrically conductive spine having a plurality of electrical connectors and first via chains connected at individual points to said first conductor, and forming a second conductor in a second area of said wafer, said second conductor comprising an electrically conductive spine having a plurality of electrical connectors and second via chains connected at individual points to said second conductor,
        each of said first via chains comprising an open-ended electrical circuit beginning at said first conductor and ending in an insulated region of said second area,
        each of said second via chains comprising an open-ended electrical circuit beginning at said second conductor and ending in an insulated region of said first area, said first via chains and said second via chains alternating along a length of said first area and said second area, said second area of said wafer being adjacent to and contacting said first area of said wafer, and said testing comprising identifying current leakage between said first via chains and said second via chains.

2. The method according to claim 1, said identifying current leakage between said first via chains and said second via chains comprising:

voltage drop testing;
current leakage testing; or
time-dependent dielectric breakdown (TDDB) testing.

3. The method according to claim 1, said first via chains comprising first electrical circuits beginning at said first conductor at a first location within said first area, and said second via chains comprising second electrical circuits beginning at said second conductor at a second location within said second area.

4. The method according to claim 1, said first via chains being electrically insulated from said second via chains.

5. The method according to claim 1, said first via chains and said second via chains comprising:

first conductive segments formed at a first layer of said wafer and second conductive segments formed at a second layer of said wafer, said first conductive segments and said second conductive segments being interconnected by vias.

6. The method according to claim 5, said first via chains and said second via chains forming geometrically shaped portions comprising one of:

geometric structures that alternate by type, across two or more layers of said wafer; and serpentine and comb structures that alternate in type or instance, in a single layer of said wafer.

7. The method according to claim 2, said testing further comprising:

quantitatively establishing a voltage drop threshold based on actual voltage versus applied voltage.

8. A method comprising:

forming first via test structures in kerf areas between integrated circuit chips on a wafer, said first via test structures comprising a first electrically conductive spine in a first area of said wafer, said first electrically conductive spine having first electrical connectors protruding from a base of said first electrically conductive spine and first via chains connected to each of said first electrical connectors, each of said first via chains comprising an open-ended electrical circuit beginning at said first electrically conductive spine and ending in an insulated region of a second area of said wafer;

forming second via test structures in said kerf areas between said integrated circuit chips on said wafer, said second via test structures comprising a second electrically conductive spine in a second area of said wafer, said second electrically conductive spine having second electrical connectors protruding from a base of said second electrically conductive spine and second via chains connected to each of said second electrical connectors, each of said second via chains comprising an open-ended electrical circuit beginning at said second electrically conductive spine and ending in an insulated region of said first area of said wafer, said first via chains and said second via chains alternating along a length of said first area of said wafer and said second area of said wafer, and said first via chains being intertwined with said second via chains;

touching a first test probe having a first voltage potential to said first electrically conductive spine;

touching a second test probe having a second voltage potential to said second electrically conductive spine; and measuring current leakage between said first via chains and said second via chains.

9. The method according to claim 8, said second area of said wafer being adjacent to and contacting said first area of said wafer.

10. The method according to claim 8, said measuring current leakage between said first via chains and said second via chains comprising:

voltage drop testing;
current leakage testing; or
time-dependent dielectric breakdown (TDDB) testing.

11. The method according to claim 10, said testing further comprising:

quantitatively establishing a voltage drop threshold based on actual voltage versus applied voltage.

12. The method according to claim 8, said first via chains being electrically insulated from said second via chains.

13. The method according to claim 8, said forming first via test structures comprising:

forming first conductive segments in a first level of said first via chains;

forming second conductive segments in a second level of said first via chains, said second conductive segments being disposed at an angle to said first conductive segments, and said first level being different from said second level; and interconnecting said first conductive segments and said second conductive segments by vias.

14. The method according to claim 13, said forming first via test structures further comprising:

forming geometrically shaped portions that alternate by type across two or more layers of said wafer.

15. The method according to claim 8, said forming second via test structures comprising:

forming third conductive segments in a first level of said second via chains;

forming fourth conductive segments in a second level of second first via chains, said third conductive segments being disposed at an angle to said fourth conductive segments, and said first level being different from said second level; and interconnecting said third conductive segments and said fourth conductive segments by vias.

16. The method according to claim 15, said forming second via test structures further comprising:

forming geometrically shaped portions that alternate by type across two or more layers of said wafer.

17. The method according to claim 8, further comprising:

after measuring current leakage between said first via chains and said second via chains, separating said integrated circuit chips from each other, said separating destroying said kerf areas of said wafer.

18. A method comprising:

forming first test structures in a first area of an integrated circuit wafer, said first test structures comprising first comb-and-serpentine via test chain structures, each via test chain of said first comb-and-serpentine via test chain structures comprising an open-ended electrical circuit beginning at a first electrically conductive spine and ending in an insulated region of a second area of said wafer;

forming second test structures in a second area of an integrated circuit wafer, said second test structures comprising second comb-and-serpentine via test chain structures, each via test chain of said second comb-and-serpentine via test chain structures comprising an open-ended electrical circuit beginning at a second electrically conductive spine and ending in an insulated region of said first area of said wafer, said second area of said wafer being adjacent to and contacting said first area of said wafer, said first comb-and-serpentine via test chain structures being in opposed relationship with said second comb-and-serpentine via test chain structures, and via test chains of said first comb-and-serpentine via test chain structures being intertwined with via test chains of said second comb-and-serpentine via test chain structures along a length of said first area and said second area; and measuring current leakage between said first comb-and-serpentine via test chain structures and said second comb-and-serpentine via test chain structures by at least one of:

voltage drop testing;

current leakage testing; and time-dependent dielectric breakdown (TDDB) testing.

19. The method according to claim 18, further comprising: electrically insulating said first comb-and-serpentine via test chain structures from said second comb-and-serpentine via test chain structures.

20. The method according to claim 18, said forming first test structures comprising:

forming a first electrically conductive spine in said first area of said wafer, said first electrically conductive spine comprising first electrical connectors protruding from a base of said first electrically conductive spine and first via chains connected to each of said first electrical connectors;

forming first conductive segments in a first level of said first via chains;

forming second conductive segments in a second level of said first via chains, said second conductive segments being disposed at an angle to said first conductive segments; and interconnecting said first conductive segments and said second conductive segments by vias; and said forming second test structures comprising:

forming a second electrically conductive spine in said second area of said wafer, said second electrically conductive spine comprising second electrical connectors protruding from a base of said second electrically conductive spine and second via chains connected to each of said second electrical connectors;

forming third conductive segments in said first level of said second via chains;

forming fourth conductive segments in said second level of said second via chains, said fourth conductive segments being disposed at an angle to said third conductive segments, said first level being different from said second level; and interconnecting said first conductive segments and said second conductive segments by vias; and electrically insulating said first comb-and-serpentine via test chain structures from said second comb-and-serpentine via test chain structures.

* * * * *